US012563802B2

(12) United States Patent
Jang et al.

(10) Patent No.: US 12,563,802 B2
(45) **Date of Patent: \*Feb. 24, 2026**

(54) PROCESSING METHOD FOR SUBSTRATE

(71) Applicant: WONIK IPS CO., LTD.,
Pyeongtaek-si (KR)

(72) Inventors: Won Jun Jang, Seoul (KR); **Kyung
Park, Seoul (KR); Young Jun Kim**,
Pyeongtaek-si (KR)

(73) Assignee: WONIK IPS CO., LTD.,
Pyeongtaek-si (KR)

( * ) Notice: Subject to any disclaimer, the term of this
patent is extended or adjusted under 35
U.S.C. 154(b) by 119 days.

This patent is subject to a terminal dis-
claimer.

(21) Appl. No.: 18/486,043

(22) Filed: Oct. 12, 2023

(65) Prior Publication Data

US 2024/0038538 A1 Feb. 1, 2024

Related U.S. Application Data

(63) Continuation of application No. 17/015,914, filed on
Sep. 9, 2020, now Pat. No. 11,823,907.

(30) Foreign Application Priority Data

Oct. 16, 2019 (KR) ........................ 10-2019-0128243
Oct. 16, 2019 (KR) ........................ 10-2019-0128244
Oct. 16, 2019 (KR) ........................ 10-2019-0128245

(51) Int. Cl.
*H01L 21/28* (2025.01)
*H10D 64/27* (2025.01)
*H10D 64/66* (2025.01)

(52) U.S. Cl.
CPC .. *H01L 21/28088* (2013.01); *H01L 21/28079*
(2013.01); *H10D 64/513* (2025.01); *H10D
64/665* (2025.01); *H10D 64/667* (2025.01)

(58) Field of Classification Search
CPC ........ H01L 21/28088; H01L 21/28079; H10D
64/513; H10D 64/665; H10D 64/667
See application file for complete search history.

(56) References Cited

U.S. PATENT DOCUMENTS

| | | | |
|---|---|---|---|
| 2012/0196450 A1 | 8/2012 | Balseanu et al. | |
| 2015/0093916 A1 | 4/2015 | Yamamoto et al. | |
| 2017/0062204 A1 | 3/2017 | Suzuki et al. | |
| 2017/0062249 A1 * | 3/2017 | Aoyama | H01L 21/28185 |
| 2018/0277400 A1 * | 9/2018 | Aiso | H01L 21/6719 |
| 2019/0244803 A1 | 8/2019 | Suzuki | |

FOREIGN PATENT DOCUMENTS

| | | |
|---|---|---|
| CN | 106486397 A | 3/2017 |
| JP | 1997143691 A | 6/1997 |
| JP | 2012104808 A | 5/2012 |
| JP | 2015010247 A | 1/2015 |
| JP | 2015026693 A | 2/2015 |
| JP | 2017045982 A | 3/2017 |

(Continued)

*Primary Examiner* — Mohammed R Alam
(74) *Attorney, Agent, or Firm* — WILLIAM PARK AND
ASSOCIATES LTD.

(57) ABSTRACT

The present invention relates to a substrate processing
method, and more particularly, to a processing method for
substrate for removing impurities from inside a thin film of
a substrate and improving characteristics of the thin film.

20 Claims, 11 Drawing Sheets

(56) References Cited

FOREIGN PATENT DOCUMENTS

| | | | |
|----|--------------|---|--------|
| JP | 2017045983   | A | 3/2017 |
| JP | 2018137378   | A | 8/2018 |
| KR | 1020200006422 | A | 1/2020 |
| KR | 1020200029895 | A | 3/2020 |
| KR | 1020200031798 | A | 3/2020 |
| TW | 201728777    | A | 8/2017 |

* cited by examiner

Si

Cl

Si       Cl       H

Si

PROCESSING METHOD FOR SUBSTRATE

CROSS-REFERENCE TO RELATED APPLICATIONS

This U.S. non-provisional patent application is a continuation application of U.S. patent application Ser. No. 17/015,914, filed on Sep. 9, 2020, and claims priority under 35 U.S.C. § 119(a) of Korean Patent Application No. 10-2019-0128243, filed on Oct. 16, 2019, Korean Patent Application No. 10-2019-0128244, filed on Oct. 16, 2019, and Korean Patent Application No. 10-2019-0128245, filed on Oct. 16, 2019, in the Korean Intellectual Property Office, the entire contents of which are hereby incorporated by reference.

FIELD OF THE INVENTION

The present invention disclosed herein relates to a processing method for substrate, and more particularly, to a processing method for substrate for removing impurities from inside a thin film on a substrate and improving characteristics of the thin film.

BACKGROUND ART

In general, substrate processing methods may include a process for forming a film by deposition.

However, in typical arts, regarding techniques for removing impurities from inside a film and improving film characteristics after forming a thin film on a substrate, there have been no particularly well known technique that is particularly preferred or completely verified in industries.

In particular, as three-dimensional devices and substrates having high aspect ratios appeared, film deposition temperatures have been further lowered or sources having higher impurity contents have been inevitably used in order to satisfy a step coverage standard, and thus, it becomes more difficult to remove impurities from inside a film.

Thus, there is demanded a processing method for substrate that is capable of removing impurities present inside a film without degradation in film characteristics and thereby improving the film characteristics after forming the film.

In addition, recently, techniques for further reducing a planar space occupied by devices have been advanced.

For example, a technique of making a two-dimensional shape by forming a valley in a substrate without forming planar channel regions of transistors on a substrate, or a technique of using a structure vertically stacked on the substrate have been gradually generalized.

Particularly, in case of NAND flash memories, memory cell transistors for storing binary information may also be vertically stacked in several hundred stages.

In order to manufacture an integrated circuit device, several types of thin films should necessarily be formed repeatedly on a substrate.

In thin film formation, a desired-thickness thin film is formed by supplying mutually different raw material gases, a reaction gas, a carrier gas, and the like into a chamber, in which reactions will occur, and applying appropriate temperatures and pressures.

There is a tendency that the smaller the size of an element gradually, the thinner the thin film formed on the element relatively.

In order to form such a thin film on a substrate surface, there may be caused an extremely trace amount of incompleteness present on the substrate surface, for example, elements such as nitrogen that forms weak bonds with a trace amount of chlorine (Cl) or silicon may remain on the substrate surface and act as contamination sources to cause the incompleteness.

The types of incompleteness present on substrate surfaces are diversified. A trace amount of silicon elements remaining in a dangling bond state, or the presence of covalent bonds in an incomplete state may correspond to the incompleteness.

Such incompleteness will remarkably affect later thin film formation. For example, these incomplete impurities occupy the place in which silicon atoms should be bonded to oxygen elements, so that an element bond for complete silicon dioxide ($SiO_2$) film may not be formed, and this consequently affects the film quality.

Other incompleteness is a case in which defects in silicon crystal structures, for example, defects such as grain boundaries appear in a substrate surface.

Still other incompleteness is caused by specific elements (for example, chlorine (Cl)) due to the remaining gas inside a chamber.

Furthermore, elements such as chlorine (Cl) gradually move between the lattices of thin film even after forming a metal thin film such as an oxide film or a TiN film, but the elements mainly move to an interface surface between the film and a silicon substrate and consequently contribute to the incompleteness of the substrate surface.

Ideally, all Ti elements constituting the thin film should be bonded to N element, but despite of such a reductive reaction, some chlorine (Cl) elements remain in the interface surface between the oxide film and the TiN layer and thereby act as contaminating impurities.

These impurities consequently deteriorate the characteristics of devices. For example, there occur problems in which the threshold voltage Vt of a transistor brings a change in characteristics, the distribution of capacitance values of capacitors is widened, or the voltage-resistance of device degrades.

Since the above-described incompleteness of the substrate surface has appeared as a bigger problem, a clear substrate surface or a thin film surface becomes necessary according to this tendency.

To this end, a special preprocessing is required even before forming a thin film on a substrate or forming another thin film on a single thin film.

In most thin film forming processes, it is well known to undergo a so-called preprocessing process of cleaning the surface of the place, on which a thin film is to be formed, before film forming.

The preprocessing is to remove in advance incompleteness of a substrate surface before film formation to minimize the exerted influence in the electrical and physical characteristics of the thin film.

Such preprocessing methods include chemical methods, mechanical methods, and mechanochemical methods as combinations of the two methods.

Despite undergoing the preprocessing process, the effect of the preprocessing gradually decreases due to gradually miniaturized device structure, and such a half-decrease phenomenon of preprocessing effect is more apparent particularly in a device configuration having a three-dimensional structure.

For example, when a large-aspect-ratio groove is formed inside a substrate and the inside of the groove is to be used as a channel region of a transistor as in the case of a buried channel array transistor (BCAT), an insulating thin film, that is, a gate oxide film, is first formed in the groove and then a gate material is filled in the groove.

At this point, in order to form a groove having a buried shape, a method of photo-masking or surface etching is applied as in most semiconductor manufacturing processes.

The surface of a semiconductor such as etched silicon is unstable and may undergo a surface oxidation or surface treatment process using ozone ($O_3$), hydrogen fluoride (HF), etc.

When a high aspect ratio is formed on a silicon substrate even after performing such a preprocessing process, a trace of incompleteness still remains on the surface and causes the thin film characteristics to be more quickly deteriorated.

In addition, in most thin film forming processes, various types of impurities remain after reactions, and such residues may include organic materials such as elements reduced from a raw material gas or a photo resist.

In addition, in the thin film forming process, since the bond between elements for forming a thin film is incomplete, a thin film may be formed in a partially damaged state.

Such impurities or damage exerts adverse effect to the physical and electrical characteristics of elements and may have to act to decrease the reliability of the entire product.

For example, ion impurities or damage inside a gate thin film cause a problem of changing the threshold voltage (Vt) of a transistor or widening the distribution of capacitance values, or degrading the voltage-resistant characteristics of devices.

Typical methods for removing impurities present in a thin film include a method for chemically processing a surface of a thin film after forming the thin film, and a method for mechanochemically grinding off a portion of a surface. However, any of the methods had an effect of only removing impurities from the thin film surface as illustrated in the impurity concentration distribution of FIG. 1, and was not so effective for removing impurities from inside the thin film.

Therefore, the quality of the entire thin film formed on a substrate becomes more important than any ever. In particular, as the thicknesses of thin films become larger, the removal of impurities from inside the thin films is also being strongly demanded.

SUMMARY OF THE INVENTION

To solve the above-mentioned limitations, the present invention provides a processing method for substrate capable of removing impurities in a thin film and improving thin film characteristics before, during, and after the forming of the thin film.

In accordance with an embodiment of the present invention, a processing method for substrate includes: a pressurizing step for raising a pressure inside a chamber to a first pressure greater than an atmospheric pressure; a first depressurizing step for lowering, after the pressurizing step, the pressure inside the chamber from the first pressure to a second pressure; and a second depressurizing step for lowering, after the first depressurizing step, the pressure inside the chamber to a third pressure lower than the atmospheric pressure.

The pressurizing step, the first depressurizing step and second depressurizing step may be repeatedly performed a plurality of times.

The pressurizing step may include: a pressure raising step for raising the pressure inside the chamber to the first pressure; and a high-pressure maintaining step for maintaining, after the pressure raising step, the pressure inside the chamber at the first pressure for a predetermined time.

In the pressurizing step, the pressure inside the chamber may be raised to the first pressure, whereby a pressurizing gas may be caused to react with impurities of the substrate to form a byproduct; in the first depressurizing step, the pressure inside the chamber may be lowered from the first pressure to the second pressure, whereby the byproduct may be moved to a surface of the substrate or out of the substrate; and in the second depressurizing step, the pressure inside the chamber may be lowered from the second pressure to the third pressure smaller than the atmospheric pressure, whereby the byproduct present in an inner space of the chamber may be discharged out of the chamber.

The second pressure may be the atmospheric pressure.

The processing method for substrate may further include a pressure maintaining step for maintaining, after the first depressurizing step, the pressure inside the chamber at the second pressure for a predetermined time.

The processing method for substrate may further include a thin film forming step for forming a thin film on the substrate after the second depressurizing step.

In the thin film forming step, a thin film may be formed inside the chamber in which the second depressurizing step is performed.

The processing method for substrate may further include a substrate transporting step for transporting, after the second depressurizing step, the substrate to a separate chamber via a transfer chamber connected to the chamber in which the second depressurizing step is performed, wherein in the film forming step, the thin film may be formed on the substrate transported into the separate chamber.

The processing method for substrate may further include a substrate transporting step for transporting, after the second depressurizing step, the substrate from the chamber of the substrate processing apparatus, in which the second depressurizing step is performed, to a chamber of a separate substrate processing apparatus, and in the film forming step, a thin film may be formed on the substrate transported into the separate chamber of the separate substrate processing apparatus.

The processing method for substrate may further include: a first thin film forming step for forming, before the pressurizing step, a thin film on a substrate; and a second thin film forming step for further forming, after the second depressurizing step, a thin film on the substrate.

In the first thin film forming step and the second thin film forming step, thin films of mutually same or mutually different types may be formed.

A single film may be formed on the substrate through the first thin film forming step and the second thin film forming step, the first forming step may form a partial thickness of the single film, and the second film forming step may form a portion or the entirety of the remaining thickness of the single film.

In at least one of the first thin film forming step and the second thin film forming step, the thin film may be formed on the substrate inside the chamber in which the pressurizing step and the second depressurizing step are performed.

In at least one of the first thin film forming step and the second thin film forming step, the thin film may be formed on the substrate inside a separate chamber via a transfer chamber connected to the chamber in which the pressurizing step and the second depressurizing step are performed.

In at least one of the first thin film forming step and the second thin film forming step, the thin film may be formed on the substrate inside a chamber of a separate substrate processing apparatus from the chamber of a substrate processing apparatus in which the pressurizing step and the second depressurizing step are performed.

The processing method for substrate may further include a thin film forming step for forming, before the pressurizing step, a thin film on a substrate.

In the thin film forming step, the thin film may be formed on the substrate inside the chamber in which the pressurizing step is performed.

In the thin film forming step, the thin film may be formed on the substrate inside a separate chamber via a transfer chamber connected to the chamber in which the pressurizing step is performed.

In the thin film forming step, the thin film may be formed on the substrate inside a chamber of a separate substrate processing apparatus from the chamber of a substrate processing apparatus in which the pressurizing step is performed.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF THE PREFERRED EMBODIMENTS

Figure 1:
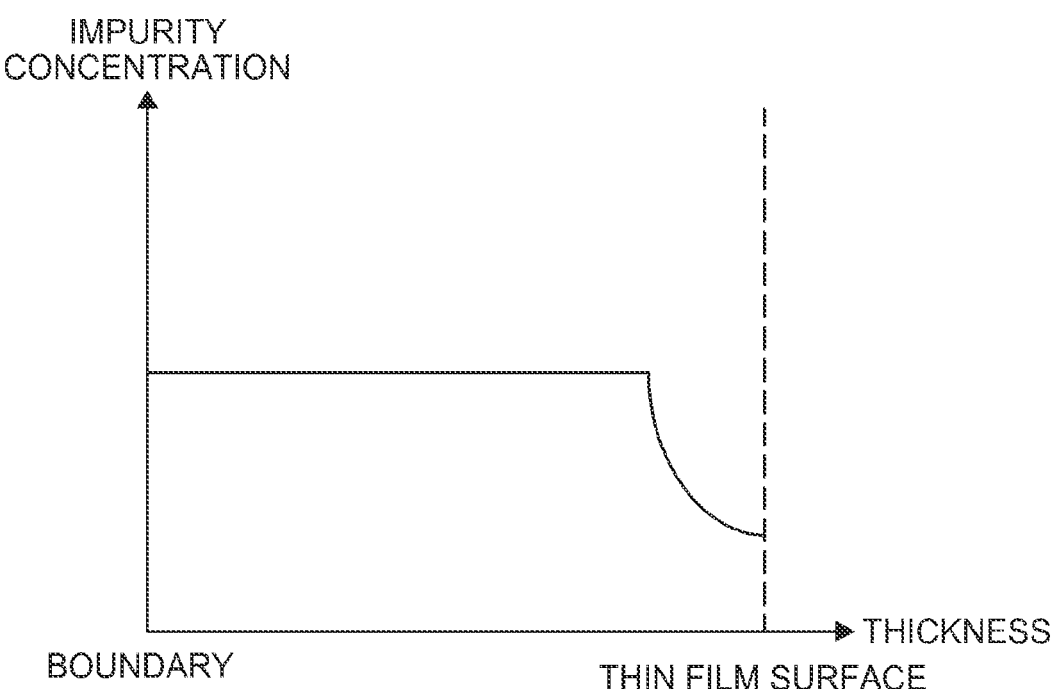
FIG. 1 is a graph schematically illustrating limitations according to a typical substrate processing.

Hereinafter, a processing method for substrate according to the present invention will be described with reference to the accompanying drawings.

The terms used in the specification and claims should not be understood to be limited in general or dictionary meanings, and be understood as meanings and concepts conforming to technical matters of the present invention.

The embodiments described in the specification and the configurations illustrated in drawings are preferable embodiments of the present invention and do not represent all technical concepts of the present invention. Therefore, there may be various equivalents or modified examples that can replace the preferable embodiments at time of the present filing.

In the specification of the present invention, a thin film formed on a semiconductor substrate may have materials with different types and shapes, so that it should be understood that a suffix of "layer" may also be attached to the film.

This is caused by the characteristics of semiconductor technology, and this is because various types and forms of semiconductor substrates are manufactured by using techniques such as masking and etching using a photolithography technique, diffusion, deposition, ion implantation, and sputtering.

This is because a semiconductor substrate may also be manufactured so as to have a structure in which, for example, a thin film itself may be buried or stacked, or other materials may be buried or stacked on the substrate surface and on the thin film.

Therefore, the expressions such as "oxidized thin film", "oxidized layer", "metal thin film", "metal layer", "semiconductor", "silicon", or expressions similar thereto should be understood to equivalent to each other in a suitable range according to technical concepts of the present invention, or sometimes understood as a modified example.

In the specification of the present invention, the terms such as "chamber", "reactor", "reaction chamber", "furnace", and the like should not be understood to delimit a specific form or structure, but should be understood merely as a meaning of a device for performing a well-known integrated circuit process such as film formation or etching on a semiconductor wafer or as a device similar thereto, and according to cases, these terms may be interchangeably used.

In addition, the present invention is to improve incompleteness of several surfaces that occurs in a process of treating a semiconductor substrate, so that it should be understood that the term "surface" does not mean only a surface of a semiconductor substrate, but may mean a surface or a boundary surface formed on the semiconductor according to cases.

In addition, according to technical concept of the present invention, the fact that the term "surface" does not mean only a "boundary surface" optically observed, but may also mean a range up to a predetermined depth into a thin film or a semiconductor substrate is due to the surface processing characteristics of the present invention, and thus should be naturally accepted in the entirety of the specification of the present invention.

A processing method for substrate according to the present invention includes: a pressurizing step for raising a pressure inside a chamber to a first pressure greater than the atmospheric pressure; a first depressurizing step for lowering, after the pressurizing step, the pressure inside the chamber from the first pressure to a second pressure; and a second depressurizing step for lowering, after the first depressurizing step, the pressure inside the chamber to a third pressure lower than the atmospheric pressure.

In addition, the processing method for substrate according to the present invention may further include a pressure maintaining step for maintaining, after the first depressurizing step, the pressure inside the chamber at the second pressure for a predetermined time.

In addition, the processing method for substrate according to the present invention may include a thin film forming step for forming a thin film before or after performing the pressurizing step, the first depressurizing step and the second depressurizing step, and the thin film forming step at these points will be described later as respective embodiments.

In the processing method for substrate according to the present invention, a pressure changing step is defined to include the pressurizing step, the first depressurizing step and the second depressurizing step.

As illustrated in FIGS. 3 to 5 and FIGS. 7 to 9, the pressure changing step is a step for raising the pressure inside the chamber to the first pressure greater than the atmospheric pressure, and then lowering the pressure inside the chamber from the first pressure to a pressure smaller than the atmospheric pressure, and may be performed though various methods.

For example, in the pressure changing step, the pressure inside the chamber may be controlled by adjusting the supply amount of a pressurizing gas supplied to raise or lower the pressure inside the chamber, and in another example, the pressure inside the chamber may be controlled by adjusting the degassing inside the chamber.

At this point, the pressure inside the chamber may of course be controlled by adjusting together the supply amount and degassing amount to/from the inside of the chamber.

The pressure changing step may be performed by repeating a plurality of times a step for raising the pressure inside the chamber to the first pressure greater than the atmospheric pressure so that the pressure inside the chamber reaches the first pressure greater than the atmospheric pressure and lowering the pressure inside the chamber from the first pressure to a pressure smaller than the atmospheric pressure so that the pressure inside the chamber reaches the pressure smaller than the atmospheric pressure from the first pressure.

More specifically, the pressure changing step may raise the pressure inside the chamber to the first pressure greater than the atmospheric pressure, lower the pressure inside the chamber to the second smaller than the first pressure and then lower the pressure inside the chamber to the third pressure smaller than the second pressure and the atmospheric pressure.

In this case, various pressure ranges may be applied to the first pressure, the second pressure, and the third pressure.

For example, the first pressure may have a value within the range greater than about 1 atmosphere (760 Torr) and equal to or less than about 10 atmospheres.

In addition, the second pressure may be the atmospheric pressure, that is, 1 atmosphere (760 Torr), and the third pressure may have a value within the range of equal to or greater than about 0.01 Torr and smaller than about 1 atmosphere (760 Torr).

Meanwhile, the pressure changing step may be performed in a chamber heated to a temperature within the range of about 400-800 degrees Celsius inclusive.

That is, in the pressure changing step, pressure change is performed not only by raising and lowering the pressure inside the chamber, but also by simultaneously heating the chamber inside to a temperature within the range of about 400-800 degrees Celsius, and thus, occurrence of active removal of impurities may be induced.

In addition, in the pressure changing step, a process of raising the pressure inside the chamber to the first pressure and lowering to the third pressure smaller than the atmospheric pressure is set as a single unit cycle and the unit cycle may be repeatedly performed N times.

That is, the pressurizing step, the first depressurizing step and the second depressurizing step may be repeatedly performed a plurality of times.

Before forming a substrate surface or a second thin film layer by repeatedly performing the steps, impurities or incompleteness present on a first thin film layer may be processed with a higher degree of completion.

In addition, the pressure changing step may further include a pressure maintaining step for maintaining, after the first depressurizing step, the pressure inside the chamber at the second pressure for a predetermined time.

The pressurizing step is a step for raising the pressure inside the chamber so that the pressure inside the chamber reaches a pressure greater than the atmospheric pressure, and more preferably, a pressure within the range greater than about 1 atmosphere and equal to or smaller than about 10 atmospheres, and the step may be performed through various methods.

In particular, in the pressurizing step, byproducts may be formed by raising the pressure inside the chamber to the first pressure and causing a pressurizing gas to react with impurities of the substrate.

In the pressurizing step, the pressure inside the chamber may be raised to the first pressure greater than the atmospheric pressure by controlling at least one among the supply amount and the degassing amount of the pressurizing gas.

Accordingly, in the pressurizing step, the pressurizing gas may be enabled to permeate not only to a substrate or a surface of the thin film but also into an inside deep place, and byproducts may be formed by causing the pressurizing gas permeating to the substrate or the surface of the thin film to react with impurities present in the substrate or the thin film.

At this point, a gas of any typically disclosed type may be applied as the pressurizing gas, and the pressurizing gas may include one or more elements such as hydrogen (H), oxygen (O), nitrogen (N), chlorine (Cl), or fluorine (F).

More specifically, when the impurities on the substrate or the thin film surface are chlorine (Cl), hydrogen ($H_2$) gas is advantageous because of being reduced to hydrogen chloride (HCl) in the pressurizing step.

For example, the pressurizing step with hydrogen gas serving as the pressurizing gas will be described as follows.

In the hydrogen gas filled into the chamber, not only the density of hydrogen molecules increases due to the pressurization, but also the movements of hydrogen molecules inside the chamber may further be quickened.

In particular, hydrogen is the lightest among elements and thus may be uniformly spread even to curved structures of the substrate or the surface of the thin film, so that hydrogen is advantageous because a reaction with the impurities on the side walls or bottom surface of valleys having deep aspect ratios may more easily occur.

Specifically, when the chamber inside is heated by using hydrogen ($H_2$), the hydrogen, which is a relatively light-weight atom, may permeate to the surfaces of silicon atoms, that is, not only to the substrate and the surface of the thin film, but also to a depth of a certain degree from the surface, that is, to the inside of the substrate or the thin film.

Meanwhile, chlorine (Cl), which is an impurity, is present in a state of forming a weakly bonded state with silicon atoms, and thus, when hydrogen atoms permeate into the substrate or the surface or the inside of the thin film, a reductive reaction with the chlorine (Cl) may be caused.

Thus, in the pressurizing step, the reaction between chlorine (Cl) which is a trace amount of impurities remaining in the substrate or the thin film and hydrogen (H) may be promoted, and consequently, hydrogen chloride (HCl), which is a byproduct according to the reaction, may be formed.

In another example, in case of a TiN thin film, when a portion of the thin film is formed, the chamber may be pressurized by stopping the film formation by degassing a raw material gas and injecting, in this state, a $H_2$ gas into the chamber.

During the pressurization, not only the density of hydrogen molecules inside the chamber increases, but also the movements of hydrogen molecule gases are further quickened inside the chamber.

Therefore, the reaction with remaining chlorine (Cl) in which hydrogen molecules form a relatively weak bond or chlorine (Cl) atoms that forms a relatively strong bond is further activated, and the chlorine atoms are reduced to hydrogen chloride (HCl) gas advantageous to degassing.

Meanwhile, the above-described example is merely an example for describing the performing process and action of the pressurizing step, and is not limited to the corresponding gas, and any gas may be applied as long as the gas may form a byproduct through a reaction.

That is, the condition, the number of times, the temperature range, the type of the input gas material, and the like of the pressure changing step may vary according to the type and thickness of the thin film to be formed and the type of the process.

The pressurizing step may include: a pressure raising step for raising the pressure inside the chamber to the first pressure; and a high-pressure maintaining step for maintaining the pressure inside the chamber at the first pressure for a predetermined time.

The pressure raising step is a step for raising the pressure inside the chamber to the first pressure, and the pressure inside the chamber may be raised from the atmospheric pressure to the preset first pressure greater than the atmospheric pressure.

Meanwhile, in another example, when the entire cycle of the pressure changing step is repeatedly performed, the pressure raising step is performed in a state of having completed the second depressurizing step to be described later, and the pressure inside the chamber may be raised from a low pressure smaller than the atmospheric pressure to the preset first pressure greater than the atmospheric pressure.

The high-pressure maintaining step is a step for maintaining the pressure inside the chamber at the first pressure for a predetermined time after the pressure raising step, and may be performed through various methods.

The high-pressure maintaining step is step for maintaining the pressure in a state in which the pressure inside the chamber is raised to the first pressure greater than the atmospheric pressure through the pressure raising step, and the pressure may be maintained through controlling at least one among the supply amount and degassing amount of the pressurizing gas.

In this case, in the high-pressure maintaining step, an approach or permeation of the pressurizing gas into the substrate or the thin film pressure may be maintained active after the pressure raising step by maintaining the pressure inside the chamber for a predetermined time at the first pressure which is a high pressure.

That is, in the high-pressure maintaining step, an environment may be maintained in which a sufficient amount of the pressurizing gas is supplied into the chamber and thermal oscillations of silicon crystal atoms sufficiently increase, and thus the impurities positioned on the substrate or the thin film react with the pressurizing gas.

Thus, in the high-pressure maintaining step, the environment inside the chamber may be maintained so that the pressurizing gas reacts with the impurities and sufficiently form byproducts.

The first depressurizing step is a step for lowering, after the pressurizing step, the pressure inside the chamber from the first pressure to the second pressure and may be performed through various methods.

In particular, the first depressurizing step is a step for lowering the pressure inside the chamber from the first pressure to the second pressure and thereby moving byproducts to a substrate surface or to the outside of the substrate, and may be performed through various methods.

Meanwhile, in this case, the byproducts may of course be moved to the surface of the thin film or to the outside of the thin film.

In the first depressurizing step, the pressure inside the chamber may be lowered from the first pressure to the second pressure by controlling at least one among the supply amount of the pressurizing gas to be input and the degassing amount of the pressurizing gas inside the chamber.

The byproducts formed through the pressurizing step may be moved to the surface of the substrate or to the outside of the substrate according to a rapid pressure drop inside the chamber.

More specifically, in the first depressurizing step, outgassing may occur in which the byproducts positioned inside the substrate or the thin film among the byproducts formed through the pressurizing step may be moved to the outside of the substrate or the thin film, and the byproducts positioned on the surface of the substrate or the thin film may be discharged to the outside of the substrate or the thin film.

Meanwhile, in the first depressurizing step, the pressure inside the pressure may be lowered from the first pressure to a predetermined pressure, and the second pressure which is the preset pressure at this time may be the atmospheric pressure, that is, the air pressure.

More specifically, an example in which the pressurizing gas is a hydrogen gas and the impurity is chlorine (Cl) will be described as the following.

For example, in the first depressurizing step, the hydrogen chloride (HCl) which is a byproduct formed through the pressurizing step may be moved, through the first depressurizing step, to a surface of the substrate or the thin film or to the outside of the substrate or the thin film.

The pressure maintaining step is a step for maintaining the pressure inside the chamber at the second pressure after the first depressurizing step for a predetermined time, and may be performed through various methods.

For example, in the pressure maintaining step, the pressure inside the chamber may be maintained at the second pressure for a predetermined time in a state in which the pressure inside the chamber is lowered from the first pressure to the second pressure through the first depressurizing step.

At this point, in the pressure maintaining step, the pressure inside the chamber may be maintained for a predetermined time at the atmospheric pressure or the second pressure greater than the atmospheric pressure.

The second depressurizing step is a step for discharging the byproducts present in a chamber inside space to the outside of the chamber by lowering, after the first depressurizing step, the pressure inside the chamber space from the second pressure to the third pressure smaller than the atmospheric pressure, and may be performed through various methods.

The second depressurizing step may be a step for discharging the byproducts out of the chamber and thereby finally removing the impurities having been present in the substrate.

In the second depressurizing step, by pumping a chamber inside space, the pressure inside the chamber may be lowered from the second pressure to the third pressure lower than the atmospheric pressure, and more preferably, to a pressure equal to or greater than about 0.01 Torr and smaller than about 1 atmospheres (760 Torr), and the byproducts present inside the chamber may be discharged out of the chamber through such a pressure drop inside the chamber.

That is, in the second depressurizing step, the byproducts moved to the surface of the substrate or the outside of the substrate or thin film through the first depressurizing step may be discharged out of the chamber by performing the pumping to the chamber inner space.

Hereinafter, an experiment for confirming effectiveness of the pressure changing step according to the present invention will be described as follows.

For example, it was confirmed that when forming a tungsten (W) thin film through a deposition method, the thin film resistivity was improved by several ten percents by repeating a portion of film formation-pressure changing processes, and the voltage resistance characteristics of the thin film was confirmed.

In addition, it was confirmed that even in a case in which a tungsten thin film is deposited using $WF_2$ after seeding using $B_2H_6$ or $SiH_4$, the thin film resistivity was improved by several ten percents by repeating the partial film forming-pressure changing processes, and the voltage resistance characteristics of the thin film was improved.

Such an improvement degree may vary according to conditions such as degrees of variation in temperature and pressure, application of varying cycles, and the like.

Meanwhile, the above experimental results is meaningful in that even an improvement in characteristics of merely about 1-2 percents or smaller also has a large influence on productivity because several billions of elements are embedded in a high-tech semiconductor product.

In particular, since impurities in negative ion states such as chlorine (Cl) residues exert an adverse effect to the threshold voltage of a transistor, and thus, an influence appears in the operation speed and reliability, the impurities should be maximally removed. Therefore, the effectiveness of the present invention was sufficiently confirmed through the above experimental results.

In addition, when testing and evaluating the thin film characteristics of a TiN thin film with a thickness of about 50 angstroms (after processing a semiconductor substrate in an atmosphere of about 430° C., the reduction rate of the Cl residues in the entire thin film reached several ten percents, and in particular, the reduced amount was greater in the surface portion of the thin film. The resistivity of the thin film was improved by several ten percents.

The above-described processing method for substrate of the present invention may be performed after completely forming a thin film with a desired thickness, but it is also effective to perform the processing method for substrate after forming a portion of the thin film in the thickness of the entire thin film.

In particular, the greater the desired final thickness of the thin film, the more effective the substrate processing method.

Figure 2:
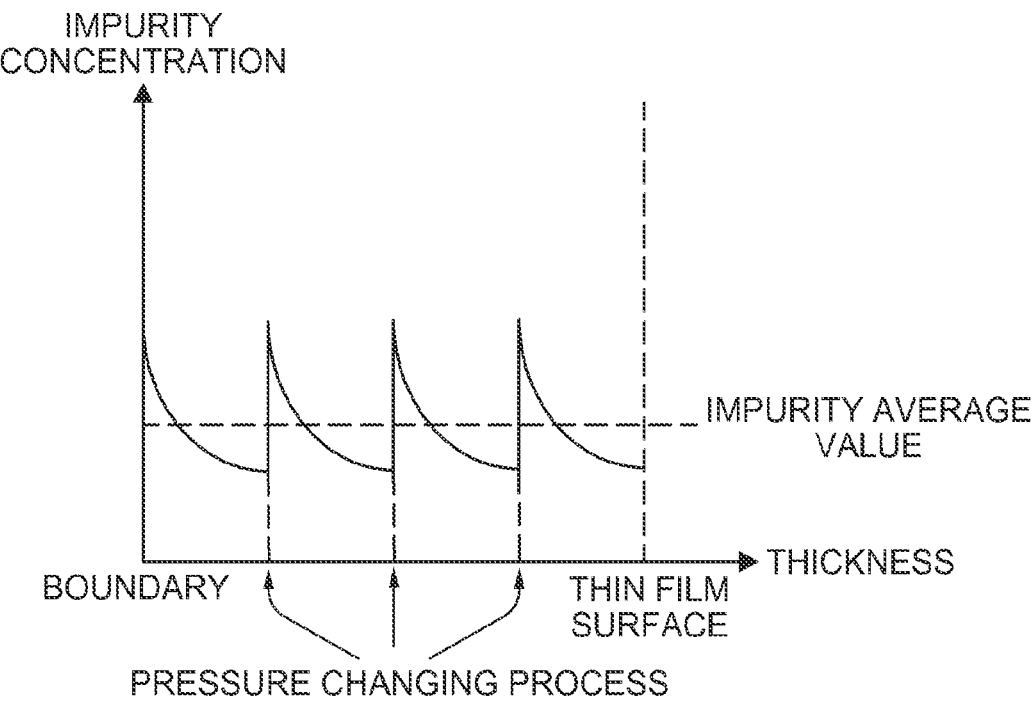
FIG. 2 is a graph schematically illustrating an effect due to substrate processing according to the present invention.
Figure 3:
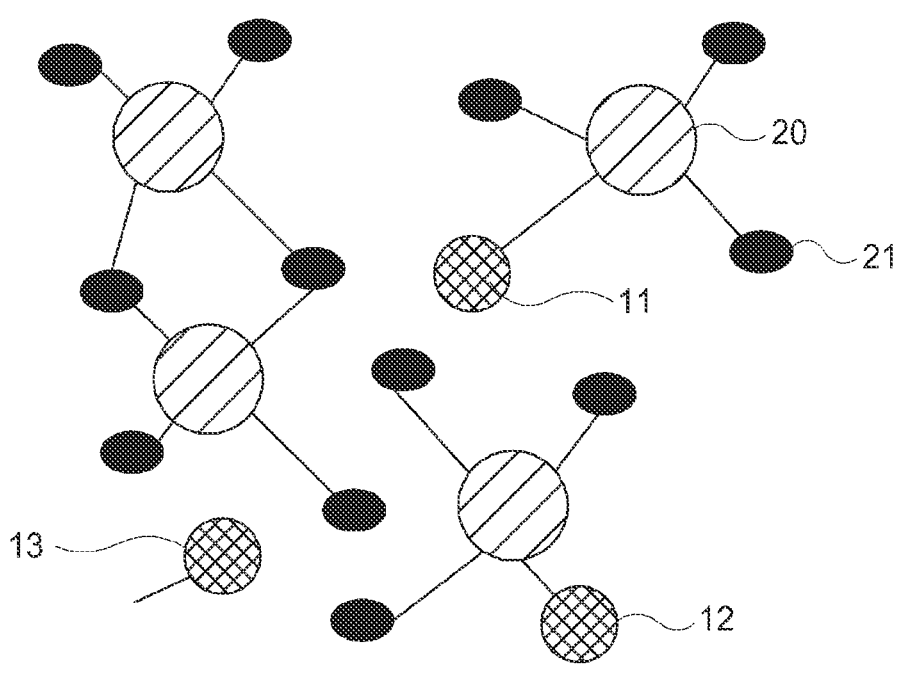
FIGS. 3 to 5 are schematic views for illustrating a processing method for substrate according to the present invention.
Figure 4:
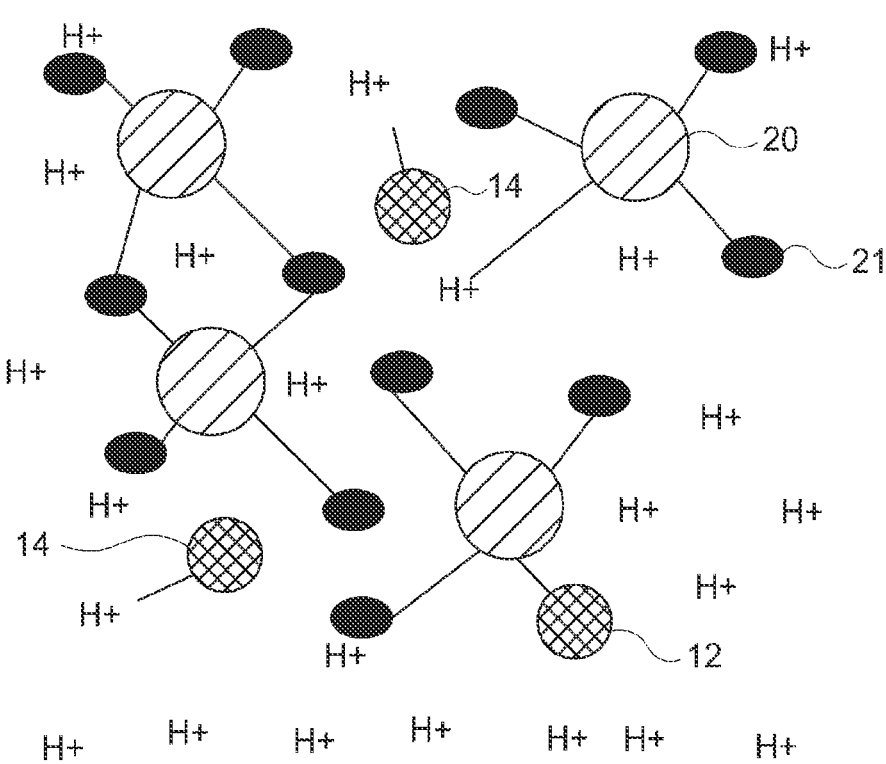
Figure 5:
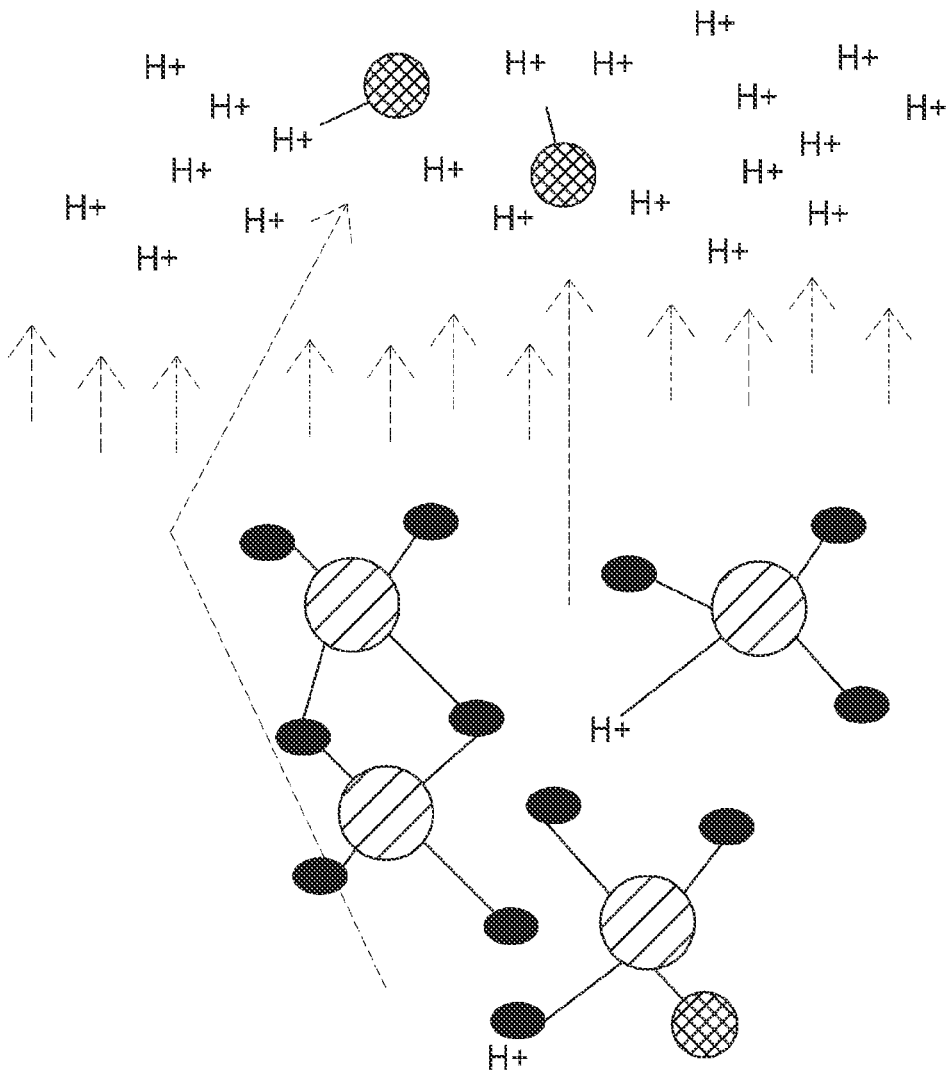

FIG. 2 schematically idealizes and illustrates effects of the processing method for substrate according to the present invention and is to illustrate an impurity removing effect when inserting the pressure changing step of the present invention by dividing the film forming process into 4 times and dividing the pressure changing step into three times of cycles between film forming processes.

In addition, in another thin film experiment to confirm the effectiveness of the present invention, it was confirmed that when repeating several times the pressure changing step on a TiN thin film with about 125 angstroms (in an atmosphere of about 400-700° C., the sheet resistance of the thin film was improved by several to several ten percents.

In still another thin film experiment to confirm the effectiveness of the present invention, for example, even in case of a tungsten (W) thin film or even when tungsten (W) and TiN forms a composite thin film, the resistivity of the thin film was remarkably improved.

In addition, the pressure changing step according to the present invention may achieve not only an effect due to removal of impurities as described above, but also various additional effects.

For example, thermal oscillations of silicon crystal atoms increase by raising the pressure inside the chamber to the first pressure greater than the atmospheric pressure, the impurities having formed weak bonds with silicon surface atoms are removed by the increased thermal oscillations, and recrystallization or migration phenomena of the substrate surface is promoted, and thus, an annealing effect may be achieved.

Such recrystallization further reinforces molecular bonds between elements constituting a thin film, and even when impurities remain, the re-adhesion of the impurities to the substrate surface by reacting with the substrate surface may be prevented.

In addition, the recrystallization may be used to process the surface of a substrate in a bare state, remove some particles, and remove dangling bonds of silicon.

Meanwhile, in the processing method for substrate according to the present invention, the pressure changing step may be performed before a thin film is formed through the thin film forming step, during the thin film forming, or after the thin film is formed.

Hereinafter, each example will be described with reference to the accompanying drawings, and the pressure changing step is applied in the same manner described above, and thus, the description on the pressure changing step will be omitted.

The processing method for substrate according to the present invention may further include, as a first example thereof, a thin film forming step for forming a thin film after the pressure changing step.

In order to help understand the processing method for substrate according to the first example, a method for forming a gate of a buried channel array transistor (BCAT) will be described as follows with reference to FIG. 6.

In order to manufacture a gate electrode 300 using the BCAT method, a valley is formed by etching a semiconductor substrate 100, such as a substrate composed of silicon crystals, and then oxide film 200-gate electrode 300 layers are sequentially formed.

The gate electrode 300 is mostly formed by using a deposition method, and when selecting and using titanium nitride (TiN) as an electrode material, a method is mainly used widely in which a deposition reaction is generated under a high temperature by injecting, into a reaction chamber on which a substrate is placed, a raw material gas of $TiCl_4$, $N_2$ or $NH_3$.

This is a method in which $N_2$ or $NH_3$ gas nitrides Ti in a high-temperature atmosphere inside the chamber, a Ti element is coupled with a N element and a TiN thin film is formed on the substrate, and the gas remaining after the reaction is reduced to $H_2$ of HCl and recovered.

At this point, the degassing of the recovered gas may be naturally discharged by opening a degassing valve connected to the chamber when the pressure of the chamber is higher than the atmospheric pressure, and may be forcibly discharged using a degassing pump.

As described above, when forming the gate electrode 300 using the $TiCl_4$ gas, a trace of chlorine (Cl) that was not discharged even after the reductive reaction may permeate into an oxide film and remains there.

Figure 6:
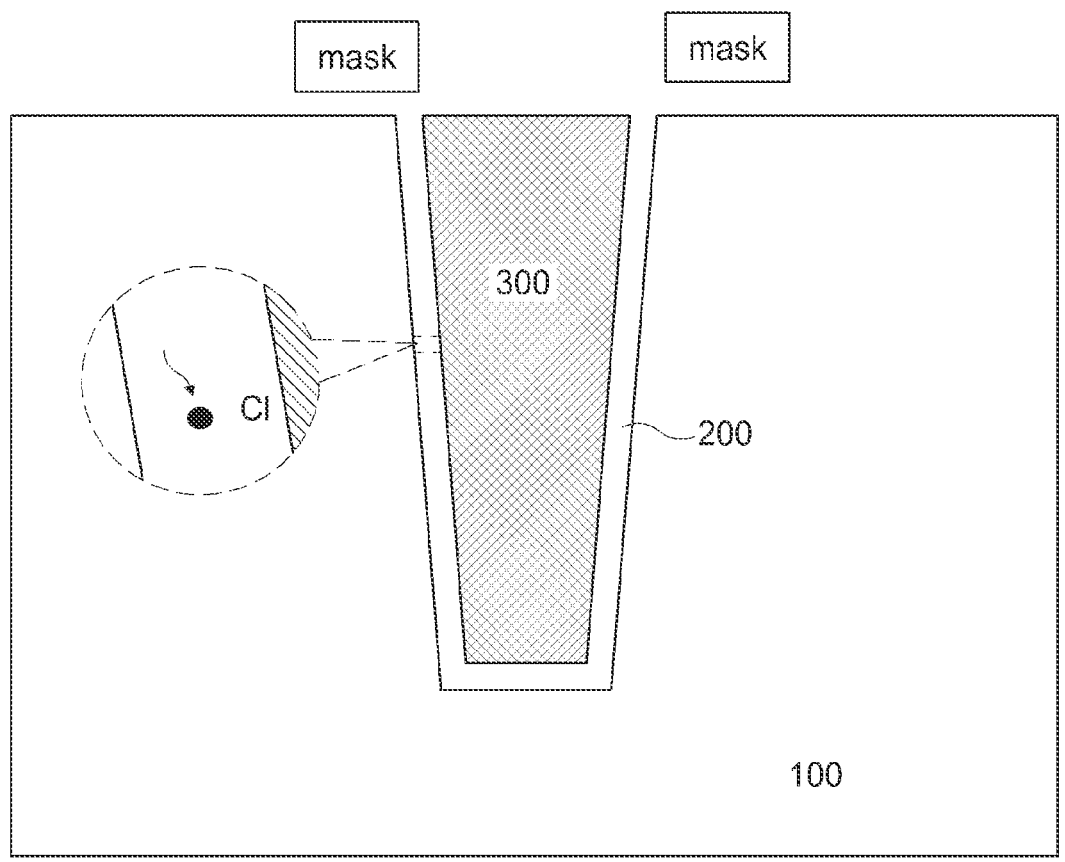
FIG. 6 is a graph illustrating limitations according to typical substrate processing.
Figure 7:
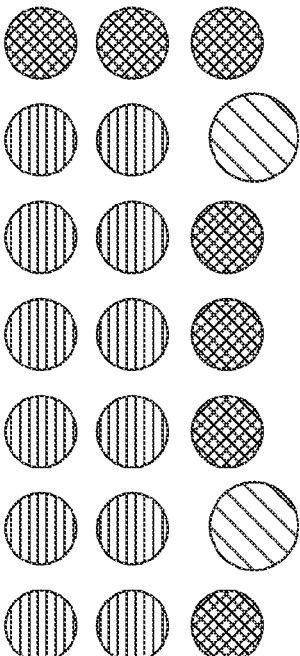
FIGS. 7 to 9 are schematic views for illustrating a processing method for substrate according another embodiment of the present invention.
Figure 7:
Figure 7:
Figure 8:
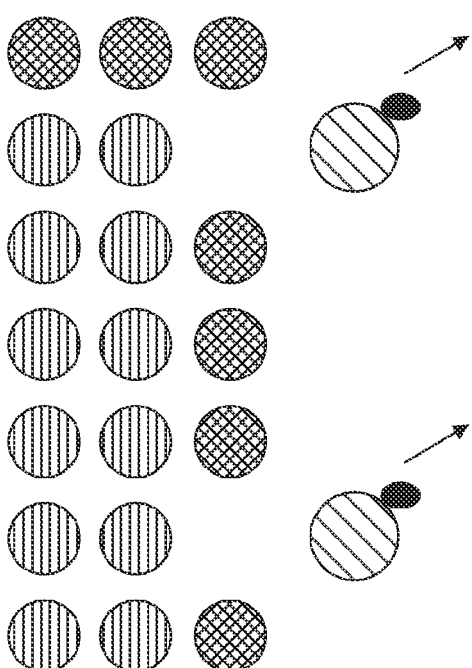
Figure 8:
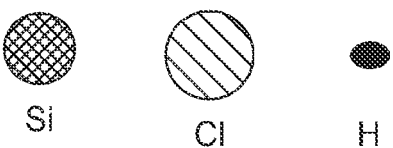
Figure 9:
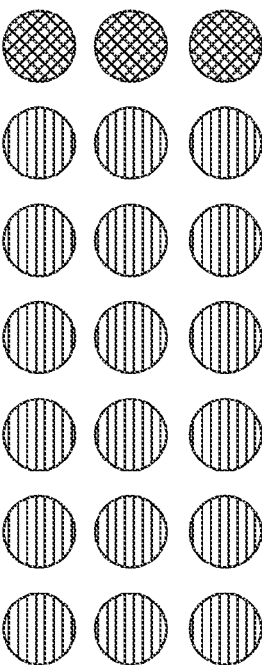
Figure 9:
Figure 10:
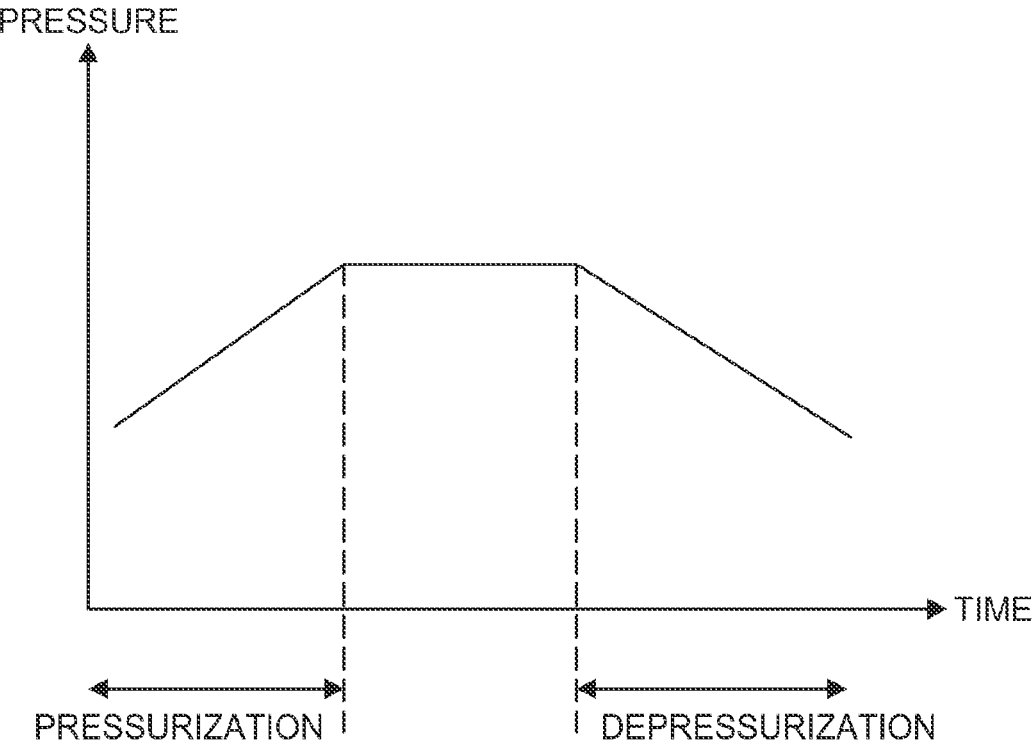
FIG. 10 is a graph for illustrating a pressure changing step of the present invention.

Furthermore, the trace of chlorine may remain in the vicinity of a very thin interface surface of silicon and act as an impurity (see expanded portion of FIG. 6).

In addition, in order to solve not only these impurities but also substrate surface incompleteness that was present before forming the TiN thin film or newly formed even in a forming process, the researchers of the present invention created a new method.

That is, before forming a desired thin film, the substrate is annealed by preprocessing the substrate with a different method.

A so-called preprocessing method through pressure change was developed in which after or before undergoing a process of surface oxidation and processing using ozone (O$_3$) and hydrogen fluoride (HF) on a substrate in a bare state, or even when such the processing process was not present, the chamber inside was pressurized under a suitable gaseous atmosphere and was then depressurized again.

Through such methods, incompleteness due to impurities or other causes in silicon interface lattices may effectively be removed.

To this end, the film forming step is a step for forming a thin film on the substrate after the pressure changing step, and may be performed through various methods.

In the thin film forming step, a film may be formed on a substrate after repeatedly performing the pressure changing step or on a preformed thin film, and the thin film is formed in a state of completing the surface treatment of the substrate or thin film and sufficiently removing impurities, and thus, the effect of the thin film may be increased.

Meanwhile, the thin film forming step may be performed through an in-situ manner with the pressure changing step.

That is, in the thin film forming step, the thin film may be subsequently formed inside a chamber in which the pressure changing step is performed.

In another example, a substrate transportation step for transporting a substrate to a separate chamber via a transfer chamber connected to the chamber, in which the pressure changing step is performed, may further be included after the pressure changing step.

In this case, in the thin film forming step, the thin film may be formed in a state in which a substrate is transported to the separate chamber through a transfer chamber connected to the chamber in which the pressure changing step is performed through the substrate transportation step.

That is, the thin film may be formed by transferring the substrate from the chamber, in which the pressure changing step has been performed under a vacuum state without separate exposure to the atmospheric pressure in a state of having performed the pressure changing step, to a separate chamber inside the same substrate processing apparatus via a transfer chamber.

Meanwhile, a substrate transportation step for transporting, after the pressure changing step, a substrate from the substrate processing apparatus, in which the pressure changing step was performed, to a chamber of a separate substrate processing apparatus may be included as another example.

In this case, in the thin film forming step, a thin film may be formed on the substrate transported inside the chamber of the separate substrate processing apparatus.

That is, in the thin film forming step, a thin film may be formed in an ex-situ method on the substrate transported from the substrate processing apparatus, in which the pressure changing step was performed, to a chamber inside the separate substrate processing apparatus.

Meanwhile, a second example of the processing method for substrate according to the present invention may include:

a first thin film forming step for forming a thin film on a substrate before a pressure changing step; and a second thin film forming step for additionally forming a thin film on the substrate after the pressure changing step.

In order to help understand the processing method for substrate according to the second example, a method for forming a thin titanium nitride (TiN) film on a semiconductor substrate and then processing the semiconductor substrate will be exemplarily described.

In order to form the TiN thin film through a deposition method, a reaction is generated at a high temperature by mostly injecting a TiCl$_4$, N$_2$, or NH$_3$ raw material gas into a reaction chamber in which a semiconductor substrate is placed.

That is, Ti is nitrided in a N$_2$ or NH$_3$ atmosphere, and a TiN thin film is formed on the semiconductor substrate by bonding of Ti elements and N elements.

The gas remaining after the reaction is reduced as H$_2$ or HCl and recovered.

At this point, the degassing of the recovered gas may be naturally performed by opening a degassing valve connected to the chamber when the pressure of the chamber is higher than the atmospheric pressure, and may be forcibly discharged using a degassing pump.

Ideally, all Ti elements constituting the thin film should be bonded to N element, but despite of such a reductive reaction, some chlorine (Cl) elements yet remain in a state of weak or strong bond with the Ti elements, or are individually present in the TiN thin film, and thus contribute to the incompleteness of the TiN thin film.

As described above, in order to solve the incompleteness of the thin film caused by various causes, the researchers of the present invention created another method.

That is, created is a method in which a film forming process is divided into several steps in a process of forming a desired type thin film, and intermediate processes are performed between the steps by a method of increasing the pressure of the gas inside the chamber and decreasing the pressure again using suitable elements while stopping the film forming.

To this end, the first thin film forming step is a step for forming a thin film on a substrate before performing a pressure changing step, and a thin film forming method of any type disclosed in typical arts may also be applied.

The second thin film forming step is a step for further forming a thin film on the substrate after the pressure changing step, and may be performed through various methods.

At this point, in the second thin film forming step, a thin film of the same type as the thin film formed through the first thin film forming step may be formed, and more specifically, a portion of the thin film may be formed through the first thin film forming step with respect to the formation of a single thin film of the same type, and the remaining thin film may be formed through the second thin film forming step.

Furthermore, in the second film forming step, a portion of the remaining thickness of the thin film of the same type may also be formed.

Meanwhile, in another example, the second film forming step may form a thin film of a different type from the thin film formed through the first thin film forming step.

For example, when a thin film with a thickness about 200 Å is formed, the thin film is formed by dividing the thickness four times into about 50 Å and the pressure changing step proposed in the present invention may be performed between the divided film forming processes.

In the second thin film forming step, a thin film may be formed on a thin film formed in advance by repeatedly performing the pressure changing step, and the thin film is formed in a state of completing the surface treatment of the thin film and sufficiently removing impurities, and thus, the effect of the thin film may be increased.

Meanwhile, at least one of the first thin film forming step and the second thin film forming step may be performed in an in-situ manner with the pressure changing step.

That is, at least one of the first thin film forming step and the second thin film forming step may be performed inside the chamber in which the pressure changing step is performed.

In another example, in at least one of the first thin film forming step and the second thin film forming step, a thin film may be performed inside a separate chamber via a transfer chamber connected to the chamber in which the pressure changing step is performed.

In this case, in at least one of the first thin film forming step and the second thin film forming step, a thin film may be formed on a substrate in a state in which the substrate is transported to a separate chamber via a transfer chamber connected to the chamber in which the pressure changing step is performed.

That is, the thin film may be formed by transporting the substrate to a separate chamber inside the same substrate processing apparatus via a transfer chamber from the chamber in which the pressure changing step was performed or to be performed under a vacuum state without separate exposure to the atmospheric pressure from the relationship to the pressure changing step.

Meanwhile, in at least one of the first thin film forming step and the second thin film forming step, a thin film may be formed on a substrate inside a chamber of a separate substrate processing apparatus from the substrate processing apparatus in which the pressure changing step is performed.

In this case, in at least one of the first thin film forming step and the second thin film forming step, a thin film may be formed on the substrate transported into a chamber of the separate substrate processing apparatus.

That is, at least one of the first thin film forming step and the second thin film forming step is an ex-situ method, in which a substrate is transported from the substrate processing apparatus in which a pressure change step is performed to a chamber in the separate substrate processing apparatus and a thin film may be formed on the substrate.

Meanwhile, the processing method for substrate according to the present invention may further include, in a third example thereof, a thin film forming step for forming a thin film before the pressure changing step.

In order to help understand the processing method for substrate according to the third example, a method for forming a thin titanium nitride (TiN) film on a semiconductor substrate and then processing the thin film will be exemplarily described.

In order to form a TiN thin film on a semiconductor substrate through a deposition method, a reaction is generated at a high temperature by mostly injecting a $TiCl_4$, $N_2$, or $NH_3$ raw material gas into a reaction chamber in which a semiconductor substrate is placed.

That is, Ti is nitrided in a $N_2$ or $NH_3$ atmosphere, and a TiN thin film is formed on the semiconductor substrate by bonding of Ti elements and N elements.

The gas remaining after the reaction is reduced as $H_2$ or HCl and recovered.

At this point, the degassing the recovered gas may be naturally performed by opening a degassing valve connected to the chamber when the pressure of the chamber is higher than the atmospheric pressure, and may be forcibly discharged using a degassing pump.

Ideally, all Ti elements constituting the thin film should be bonded to N element, but despite of such a reductive reaction, some chlorine (Cl) elements yet remain in a state of weak or strong bond with the Ti elements, or are individually present in the TiN thin film, and thus contribute to the incompleteness of the TiN thin film.

As described above, in order to solve the incompleteness of the thin film caused by various causes, the researchers of the present invention created another method.

That is, created is a method in which when a desired thin film is once formed, the chamber inside is degassed, and even after suitable degassing or even before degassing, a substrate is processed by post-processing through a so-called pressing step in which the pressure inside the chamber is increased and decreased again by selecting and using a suitable gas as illustrated in FIG. 1.

To this end, in the thin film forming step, a thin film forming method of any type disclosed in typical arts may also be applied as a step for forming a thin film on a substrate before performing the pressure changing step.

In the film forming step, the surface treatment of a substrate or a thin film may be completed and impurities may sufficiently be removed by repeatedly performing the pressure changing step after the thin film forming step, and the effect of the thin film forming may be increased and the characteristics of the thin film may be improved.

Meanwhile, the thin film forming step may be performed through an in-situ manner with the pressure changing step.

That is, in the film forming step, the thin film may be formed on a substrate inside the same chamber as the chamber in which the pressure changing step is performed, and the pressurizing step may subsequently be performed.

In another example, a substrate transportation step for transporting, after the pressure changing step, a substrate to a separate chamber via a transfer chamber connected to the chamber, in which the pressure changing step is performed, may further be included.

In this case, in the film forming step, a substrate is transported, via a transfer chamber connected to the chamber in which the pressure changing step is performed, to the chamber in which the pressure changing step is performed after forming a thin film, and a pressure changing step may be performed.

That is, in a state in which the film forming step has been performed, a substrate may be transported to a separate chamber in which the pressure changing step is to be performed in the same substrate processing apparatus via a transfer chamber under a vacuum state without separate exposure to the atmospheric pressure.

Meanwhile, another example may further include a substrate transportation step for transporting, after the film forming step, a substrate from the separate substrate processing apparatus, in which the film forming step is performed, to a chamber of a separate substrate processing apparatus in which the pressure changing step is performed may further be included.

In this case, in the film forming step, a thin film may be formed on the substrate in the chamber of the separate processing device from the substrate processing apparatus in which the pressure changing step is performed.

That is, the thin film forming step is an ex-situ method in which the pressure changing step may be performed on the thin film by transporting a substrate to a chamber inside a separate substrate processing apparatus from the substrate processing apparatus in which the film forming process is performed.

Meanwhile, a thin film of any type disclosed in typical arts, that include a non-metal element or a metal element, such as a film composed of a single element, a film composed of two or more elements, or a film in which thin films of mutually different types are compositely formed, may be applied as the thin film according to the present invention.

More specifically, the thin film may be variously configured as metallic oxide, metallic nitride, metallic oxide nitride, silicon oxide, silicon nitride, silicon oxide nitride, a metal film, a single film, a double film, or the like.

In addition, the thin film may form at least a portion among a gate insulating film of a transistor.

In addition, the thin film may include at least one among metal elements, group IV elements, nitrogen, or oxygen.

Furthermore, the thin film may include at least one among titanium (Ti), tungsten (W), tantalum (Ta) or molybdenum (Mo).

A substrate processing apparatus for performing the processing method for substrate will be described in detail as the following with reference to FIG. 11.

Figure 11:
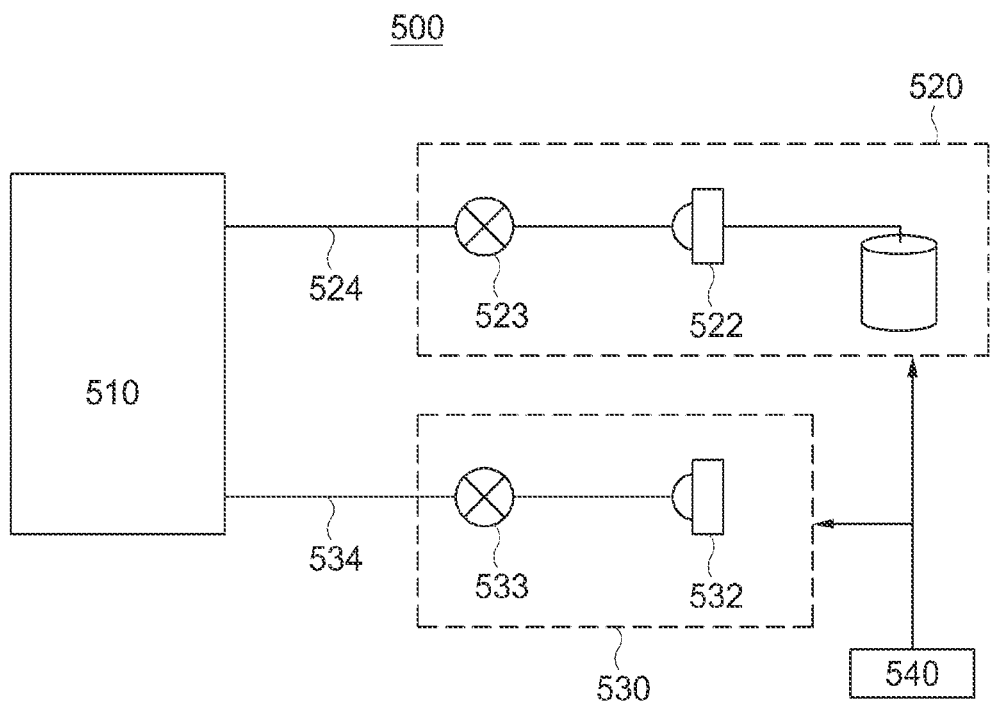
FIG. 11 is a schematic view illustrating a substrate processing apparatus for substrate processing according to the present invention.

A substrate processing apparatus 500 according to the present invention for performing a processing method for substrate according to the present invention may include, as illustrated in FIG. 11, a chamber 510, and a supply means 520 for supplying a pressurizing gas into the chamber 510, a degassing means 530 for degassing or pumping the inside of the chamber 510, and a controller 540 for adjusting the pressure inside the chamber by controlling the supply means 520 and the degassing means 530.

The chamber 510 may be a sheet fed-type device, in which a substrate is processed one by one, and the substrate processing apparatus 500 may include at least one chamber, a transfer module, and a load lock chamber, and various embodiments such as a cluster type or an inline type may be applied.

In addition, the chamber 510 may be a batch-type device in which several substrates are simultaneously processed, and the substrate processing apparatus may also include at least one batch-type vertical chamber, a transfer module, and a load port.

The supply means 520 is a configuration that is connected to the chamber 510 via a supply line 524 and is for supplying a pressurizing gas into the chamber 510, and may be variously configured.

For example, the supply means 520 may include a storage device 521 for storing a required pressurizing gas, and a supply adjustment valve 523 for supplying the chamber 510 with the pressurizing gas stored in the storage device 521.

In addition, the supply means 520 may selectively further include a pressurizing pump 522 for smooth supply of the pressurizing gas.

The degassing means 530 is a configuration that is connected to the chamber 510 via a degassing line 534 and is for degassing or pumping the inside of the chamber 510, and may be variously configured.

For example, the degassing means 530 may include a degassing pump 532 for pumping the inside of the chamber 510 and a degassing adjustment valve 533 for adjusting the degassing amount inside the chamber 510.

The controller 540 may control, during the supply of the pressurizing gas, the pressurizing pump 522 or the supply adjustment valve 523 to adjust factors related to pumping, and factors such as whether to open/close the valves, degrees of opening/closing, opening/closing times, and the like.

In addition, the controller 540 controls, during degassing, the degassing pump 532 or the degassing adjustment valve 533 to adjust the factors related to pumping and factors such as whether to open/close the valves, degrees of opening/closing, opening/closing times, and the like.

Sometimes, in order to use a natural degassing method, the degassing pump 532 or the degassing adjustment valve 533 may not be artificially controlled, and the degassing pump may not be required.

In addition, the controller 540 may include preset numerical values or a preset program for the supply means 520 and the degassing means 530.

For example, the operation times of various pumps, whether to open/close various valves, degrees of opening/closing and the like may be digitized and stored, and a program may be stored which is binarized so that a suitable control is possible according to these numerical values.

Additional effects of the above-described processing method for substrate according to the present invention are as the following.

Among the various merits of the present invention, the merit achieved when applying a pressure changing method using hydrogen that is the lightest element is more advantageous particularly for the manufacturing of semiconductors having three-dimensional structures.

Lightweight hydrogen molecules may permeate into a large trench having a large aspect ratio without difficulty, and the same pressure is applied during a pressurizing or depressurizing process regardless of the depth or height of the structure of the element formed on the semiconductor substrate, and thus, the hydrogen molecules are advantageous particularly for the manufacturing of semiconductor elements having three-dimensional structures.

Another among the various merits of the present invention is that the type of the gas used for pressurization may be selected according to the state of contaminants inside a thin film.

For example, not only hydrogen but also another element such as oxygen may also be used.

Any element may be annealed by being applied to the pressure changing method of the present invention as long as the element generates a reductive reaction with impurities according to the types of the determined impurities and is thus helpful to removal of the impurities.

Another among the various merits of the present invention is that the gas used for the pressurization in the pressure changing process enters and exits in a more vertical manner.

These merits are very important. In typical preprocessing processes, a preprocessing gas tends to flow in a horizontal manner, and the effect of the preprocessing tends to start at the outer surface of a thin film and be gradually transferred into the thin film, and thus, the effects of preprocessing on a deep bottom surface of a valley having a large aspect ratio and on a shallow bottom surface may be different.

However, the present invention has a merit in that not only an annealing effect in the vertical direction becomes uniform, but also the annealing quality of a deep surface of a deep valley becomes more uniform due to the effect of pressure change. Accordingly, the distribution of annealing quality of the entire thin film is minimized.

Another merit of the present invention is that recrystallization of thin film elements is promoted by further promoting thermal oscillations of the thin film elements, and in this process, the grain sizes of the crystals are desirably changed and the electrical, physical characteristics, such as leak current or resistivity, of the thin film are improved.

In a processing method for substrate according to the present invention, intra-film impurities may be removed by pressurizing and rapidly depressurizing through an annealing process under a high-temperature gas atmosphere after forming a thin film.

In addition, since an independent pressure change annealing process is performed after forming a thin film, a processing method for substrate according to the present invention may be applied to a wide range of substrate processing methods.

In addition, in a processing method for substrate according to the present invention, a uniform heat treatment may be performed due to a high pressure even for three-dimensional semiconductor products or semiconductors having high aspect ratios, and uniform degassing may be performed due to rapid depressurization.

In addition, in a processing method for substrate according to the present invention, a consistent heat treatment effect may be maintained by suppressing surface hardening phenomena caused by surface defects, and the thicknesses of grain boundaries may be decreased by promoting uses of metal elements and the grain sizes may be increased, and thus, the characteristics of a metal film may be improved.

In addition, a processing method for substrate according to the present invention has an effect of improving the characteristics of the thin film by pressurizing the inside of a chamber in a suitable atmosphere by selecting a suitable gas while a substrate is inside the chamber before a raw material gas containing elements for forming a thin film, and depressurizing the inside of the chamber to reduce the incompleteness of the substrate.

In addition, a processing method for substrate according to the present invention has an effect of improving the characteristics of a substrate by repeatedly performing a method in which in a process of forming a thin film having a desired thickness on a substrate, a thin film with at least a partial thickness is formed by adding a raw material gas, the chamber inside is then pressurized using a suitable gas while film formation is temporality stopped, and then the chamber inside is depressurized again to improve the characteristics of the partial thickness of the thin film.

In particular, a processing method for substrate according to the present invention has an advantage of improving the characteristics of a thin film through a relatively lower temperature and energy than those in a high-temperature, high-energy heat treatment process of typical arts by effectively removing impurities present on a substrate.

The above-disclosed subject matter merely describes some portions of preferred embodiments that can be implemented by the present invention. Therefore, as is well known, the scope of the invention shall not be construed as limited to the embodiments above, and technical ideas that share a base with the aforementioned technical idea of the present invention would all be included in the scope of the invention.

What is claimed is:

1. A processing method for substrate comprising:
a pressure changing step for raising pressure inside a chamber for processing a substrate formed with thin film to a first pressure greater than the atmospheric pressure and lowering the pressure inside the chamber to a second pressure smaller than the atmospheric pressure at a temperature that induces removal of impurities from the substrate surface, thereby heat treating the substrate;
wherein the thin film is insulating thin film.

2. The processing method for substrate of claim 1, wherein the thin film is a metallic film comprising a metal element.

3. The processing method for substrate of claim 1, wherein the thin film comprises at least one of titanium (Ti), tungsten (W), tantalum (Ta) and molybdenum (Mo).

4. The processing method for substrate of claim 1, wherein the thin film comprises silicon element (Si).

5. The processing method for substrate of claim 1, wherein the thin film comprises any one of silicon oxide, silicon nitride, silicon oxide nitride, and a composition film comprising silicon oxide, silicon nitride and silicon oxide nitride.

6. The processing method for substrate of claim 1, wherein the thin film comprises any of $SiO_2$ and SiN.

7. The processing method for substrate of claim 6, wherein the thin forms at least a portion of a gate insulating film of a transistor.

8. The processing method for substrate of claim 1, wherein in the pressure changing step, the pressure inside the chamber performed by supplying pressurizing gas into the chamber.

9. The processing method for substrate of claim 8, wherein in the pressurizing gas comprises one or more elements of hydrogen (H), oxygen (O), nitrogen (N), chlorine (CI), and fluorine (F).

10. The processing method for substrate of claim 8, wherein in the pressurizing gas comprises $H_2$.

11. The processing method for substrate of claim 1, wherein the pressure changing step comprises,
a pressurizing step for raising pressure inside the chamber to the first pressure;
a first depressurizing step for lowering, after the pressurizing step, the pressure inside the chamber from the first pressure to a third pressure between the first pressure and the second pressure; and
a second depressurizing step for lowering, after the first depressurizing step, the pressure inside the chamber to the second pressure.

12. The processing method for substrate of claim 11, wherein the pressurizing step, the first depressurizing step and the second depressurizing step are repeatedly performed a plurality of times.

13. The processing method for substrate of claim 11, wherein the pressurizing step comprises:
a pressure raising step for raising the pressure inside the chamber to the first pressure; and
a high-pressure maintaining step for maintaining, after the pressure raising step, the pressure inside the chamber at the first pressure for a predetermined time.

14. The processing method for substrate of claim 11, wherein:
in the pressurizing step, the pressure inside the chamber is raised to the first pressure, whereby a pressurizing gas is caused to combined with impurities of the substrate to form a byproduct;
in the first depressurizing step, the pressure inside the chamber is lowered from the first pressure to the second pressure, whereby the byproduct is moved to a surface of the substrate or out of the substrate; and
in the second depressurizing step, the pressure inside the chamber is lowered from the second pressure to the third pressure smaller than the atmospheric pressure, whereby the byproduct present in an inner space of the chamber is discharged out of the chamber.

15. The processing method for substrate of claim 11, wherein the third pressure is the atmospheric pressure.

16. The processing method for substrate of claim 11, further comprising a pressure maintaining step for maintaining, after the first depressurizing step, the pressure inside the chamber at the third pressure for a predetermined time.

17. The processing method for substrate of claim 1, wherein the thin film is formed on the substrate inside the chamber in which the pressure changing step is performed.

18. The processing method for substrate of claim 1, wherein the thin film is formed on the substrate inside a separate chamber via a transfer chamber connected to the chamber in which the pressure changing step is performed.

19. The processing method for substrate of claim 1, wherein the thin film is formed on the substrate inside a chamber of a separate substrate processing apparatus from the chamber of a substrate processing apparatus in which the pressure changing step is performed.

20. The processing method for substrate of claim 12, wherein temperature of the chamber performing the pressurizing step is above 400° C. and below 800° C.

* * * * *